(12) United States Patent
Chen et al.

(10) Patent No.: US 7,233,269 B1
(45) Date of Patent: Jun. 19, 2007

(54) METHOD AND APPARATUS FOR CONSTRUCTING EFFICIENT CODES FOR WYNER-ZIV VIDEO COMPRESSION SYSTEMS

(75) Inventors: Jun Chen, Urbana, IL (US); Dake He, Yorktown Heights, NY (US); Ashish Jagmohan, Irvington, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/427,970

(22) Filed: Jun. 30, 2006

(51) Int. Cl.
*H03M 7/00* (2006.01)
(52) U.S. Cl. ...................... 341/107; 714/758
(58) Field of Classification Search ............... 341/107, 341/51; 714/758; 713/186
See application file for complete search history.

(56) References Cited

U.S. PATENT DOCUMENTS

2006/0200724 A1* 9/2006 Stankovic et al. .......... 714/758

* cited by examiner

*Primary Examiner*—Rexford Barnie
*Assistant Examiner*—Joseph Lauture
(74) *Attorney, Agent, or Firm*—Whitham, Curtis, Christofferson & Cook, PC; Stephen C. Kaufman

(57) ABSTRACT

A method and apparatus are described for constructing efficient Slepian-Wolf codes for inputs that do not have uniform probability distributions, and for channels which are not symmetric. Whereas conventional Wyner-Ziv video compression systems assume symmetrical probability distributions and ignore the marginal distribution component, the invention incorporates the marginal distribution component by combining the marginal distribution and conditional distributions as input to a transform that generates a symmetrical output, which is then fed into the conventional density evolution method.

20 Claims, 5 Drawing Sheets

METHOD AND APPARATUS FOR CONSTRUCTING EFFICIENT CODES FOR WYNER-ZIV VIDEO COMPRESSION SYSTEMS

BACKGROUND OF THE INVENTION

1. Field of the Invention

The present invention relates generally to methods and apparatuses for construction of codes for data-compression. More specifically, the present invention describes a method for constructing efficient Slepian-Wolf codes for providing improved data compression for video coding systems based on Wyner-Ziv principles.

2. Background Description

Slepian-Wolf codes refer to codes used for compressing source data at an encoder, in the scenario where the decoder has access to side-information not available at the encoder. These are of great interest in several applications, including important applications in multimedia data compression. Examples of such applications include, but are not limited to, low complexity encoding of media, distributed source coding for sensor networks, scalable video coding etc. Video compression systems employing Slepian-Wolf codes are termed Wyner-Ziv video compression systems.

FIG. 1 shows a generic Wyner-Ziv video compression system. In general, a Wyner-Ziv video compression system includes a video encoder which compresses (or encodes) a video signal, and a video decoder which decompresses (or decodes) the video signal. At a given time-instant t, the video frame $f_t$ 105 is to be encoded by the encoder. In order to decode the video frame $f_t$, the decoder employs the frame decoded at the previous time-instant $f_{t-1\ 185}$. The knowledge that this previously reconstructed video-frame will be used during decompression, allows the encoder to transmit fewer bits, and thus achieve greater compression, than would otherwise be possible.

This is achieved as follows. The encoder first compresses $f_t$ 105 conventionally, using an energy-compacting transform 110 and quantization 120 (equivalent to the intra mode transform and quantization in MPEG coding). The resultant signal X 125, termed the Slepian-Wolf source, is then further compressed 130 by using a Slepian-Wolf code 145 generated by a code construction function 140. The output of compression 130 is a set of symbols 135 termed syndromes. These syndromes represent the compressed video signal. The decoder derives a signal Y 195, termed the Slepian-Wolf side-information, which is used to decode 150 the signal X 155 from the syndromes 135. Then the decoded signal X 155 is subjected to an inverse quantization 160 and inverse energy compacting transform 170 to obtain the reconstructed frame $f_t$ 175.

Both Y 195 and X 155 take values in discrete sets; denote these sets as Y and X respectively. The efficiency of compression (measured by the bit-rate of the syndromes 135 required to decode X 125 successfully at 155) depends, among other factors, on the joint probability distribution of X 125 and Y 195, given by the marginal distribution of X $\{P_x(i)\}i\in\mathbf{X}$ and the conditional distribution of Y $\{p_{Y|X=i}(j|i)\}$ $i\in\mathbf{X}, y\in\mathbf{Y}$, and on the goodness of the Slepian-Wolf code employed. The better the Slepian-Wolf code, the lower is the number of syndrome bits 135 required for successful decoding, for a given joint distribution. Slepian-Wolf codes that come close to the theoretical compression limit are termed good Slepian-Wolf codes.

Previous methods for constructing Slepian Wolf codes, have been described by Pradhan and Ramchandran, *Distributed source coding using syndromes (DISCUS): design and construction*, IEEE Transactions on Information Theory, March 2003, J. Garcia-Frias and Y. Zhao, *Compression of correlated binary sources using turbo codes*, IEEE Communications Letters, 5:417–419, October 2001, and V. Stankovic et al., *On code design for the general Slepian-Wolf problem and for lossless multiterminal communication networks*, IEEE Transactions on Information Theory, April 2006, J. Bajcsy and P. Mitran, *Coding for the Slepian-Wolf problem with turbo codes*, IEEE GLOBECOM, pp. 1400–1404, November 2001, A. Aaron and B. Girod, *Compression with side information using turbo codes*, Proceeding of IEEE Data Compression Conference (DCC), pp. 252–261, April 2002, A. D. Liveris et al., *Compression of binary sources with side information at the decoder using LDPC codes*, IEEE Communications Letters, vol. 6, pp. 440–442, 2002, T. Richardson, A. Shokrollahi, and R. Urbanke, *Design of capacity-approaching irregular low-density parity-check codes*, IEEE Trans. Inform. Theory, vol. 47, pp. 619–637, February 2001. These methods are restricted to the case where the conditional distribution $\{p_{Y|X=i}(j|i)\}$ $i\in\mathbf{X}, y\in\mathbf{Y}$, termed the channel between the source and the side-information, is output symmetric with respect to X, and these methods use linear codes designed for this output symmetric channel as Slepian-Wolf codes.

The motivation for doing this is that the design of good channel codes for output symmetric channels is well-known. In particular, the method of density evolution can be used to design efficient codes for such channels, which approaches the theoretical channel capacity.

The chief drawback of these methods is that, since they do not deal with the complete joint distribution but merely the conditional distribution p(•|•), the constructed codes can be very inefficient for Slepian-Wolf coding. For example, as has been previously reported in Li et al., *Slepian-Wolf coding for nonuniform sources using Turbo codes*, Proceeding of IEEE Data Compression Conference (DCC), pp. 312–321, March 2004, if the input source does not have a uniform probability distribution, these codes can be arbitrarily inferior, compared to the best theoretically achievable Slepian-Wolf performance. Similarly if the actual correlation channel is not output symmetric, these constructions yield codes with poor Slepian-Wolf performance.

FIG. 2 shows the conventional Slepian-Wolf code design methodology. As can be seen the conditional distribution channel p(•|•) 220 is input to the density evolution method 230, and the resultant channel code 245 is used as a Slepian-Wolf code. Note that joint distribution 210 is not taken into account in developing the Slepian-Wolf code 245.

To eliminate the performance loss in Wyner-Ziv coding, caused by inefficient Slepian-Wolf codes, it is essential that the joint distribution 210 be taken into account when designing the Slepian-Wolf code. The main hurdle faced in this attempt is that there are no previously known computationally feasible methods for constructing good Slepian-Wolf codes for arbitrary distributions.

SUMMARY OF THE INVENTION

Therefore an object of the invention is to take the complete joint distribution into account, including both the marginal distribution and the conditional distribution, in generating Slepian-Wolf codes.

It is also an object of the invention to obtain efficient Slepian-Wolf codes for non-symmetric distributions, that is, codes that are close to the Slepian-Wolf limit for compression efficiency.

A further object of the invention is to provide a computationally feasible method for constructing good Slepian-Wolf codes for arbitrary distributions.

These objectives are accomplished by a method that generates a marginal distribution of original source information and a conditional distribution of original side-information, transforms the marginal and conditional distributions to generate a new conditional distribution that is symmetric, and then computes a Slepian-Wolf code by applying a density evolution algorithm to the new conditional distribution.

In another aspect of the invention, the original source information X takes values in a discrete set X and said side information Y takes values in a discrete set Y, and the marginal distribution of the original source information X is represented by $p_X(i)$ and the conditional distribution of the original side information Y is represented by $p_{Y|X=i}(j|i)$ for all i∈X and j∈Y, and the transformation generates a new conditional distribution satisfying the constraint $p_{U|V=k}(l|k) = p_{U|V=k}(|U|-l||V|-k)$, where l∈U with $|U|=|X||Y|$, and k∈V with $|V|=|X|$, and for each fixed l and k $p_{U|V=k}(l|k)$ is a predetermined function of $\{p_{Y|X=i}(j|i)\}$ and $\{p_X(i)\}$.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
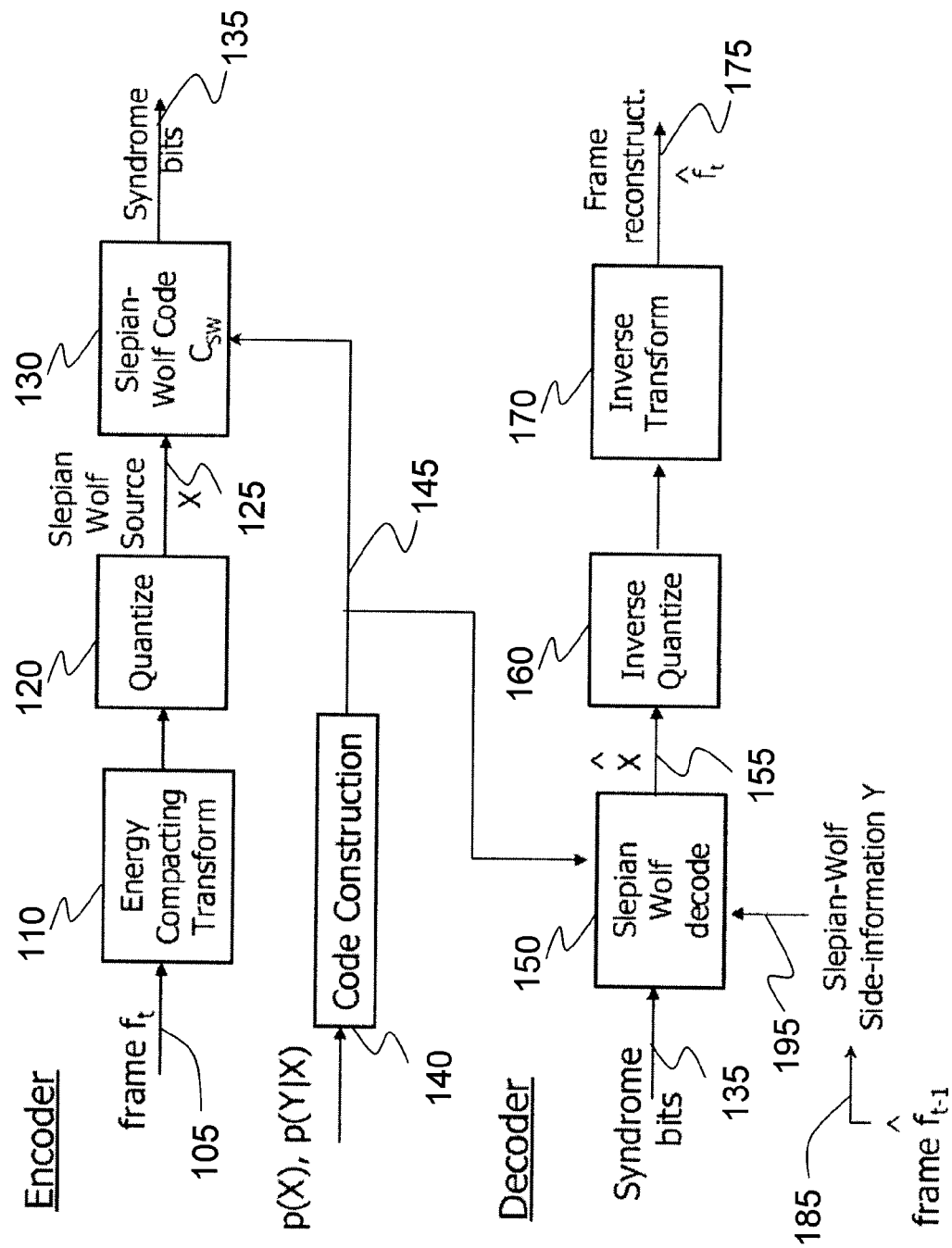
FIG. 1 is a diagram illustrating a generic Wyner-Ziv video compression system.
Figure 2:
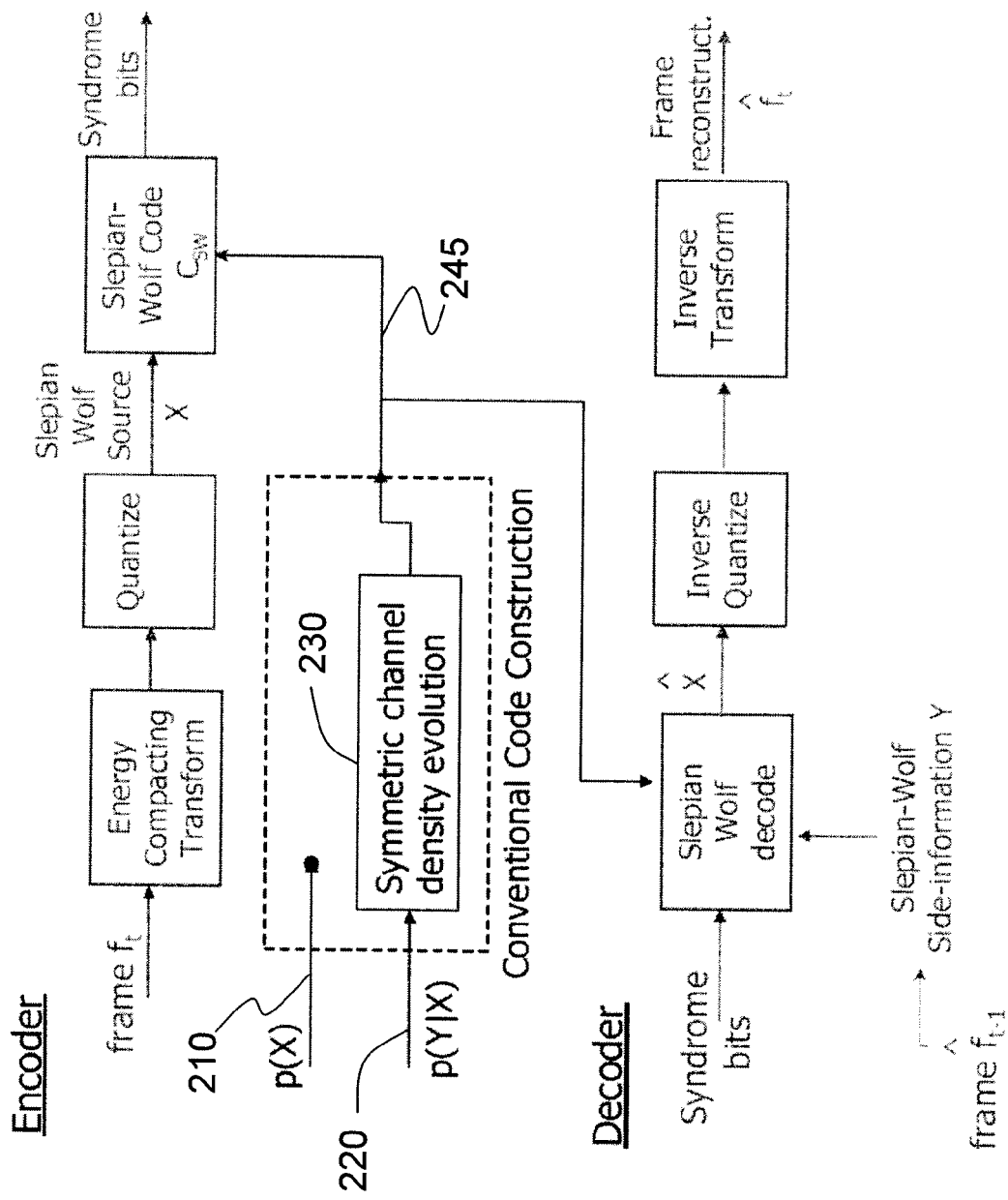
FIG. 2 is a diagram illustrating a conventional Slepian-Wolf code construction method.
Figure 3:
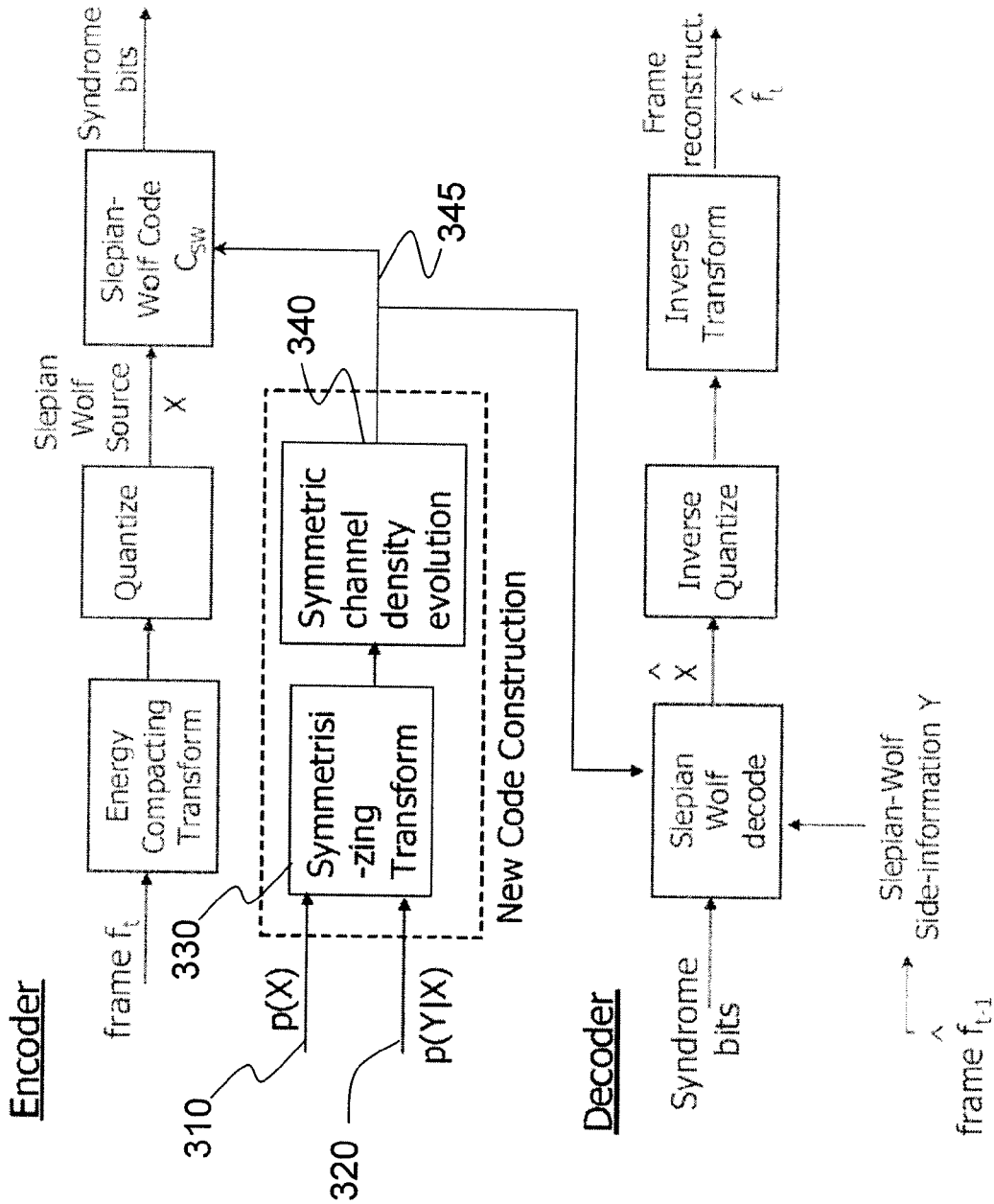
FIG. 3 is a diagram illustrating an improved method for Slepian-Wolf code construction.

Referring now to the drawings, and more particularly to FIG. 3, there is shown the improved code construction method provided by the invention. The marginal distribution $p_{(X)}$ 310 and the conditional distribution $p_{(X|Y)}$ 320 are inputs to a symmetrisizing transform 330. The symmetrisizing transform 330 plays a crucial role in the method, since it generates as output a symmetric channel, given by the values $\{p_{U|V=k}(l|k)\}$ for k∈(1, |V|), l∈{1, |U|}, for which density evolution 340 can be used to construct Slepian-Wolf codes. Moreover, the symmetrisizing transform 330 ensures that the Slepian-Wolf code thus constructed is a good code, in terms of compression efficiency.

Figure 4:
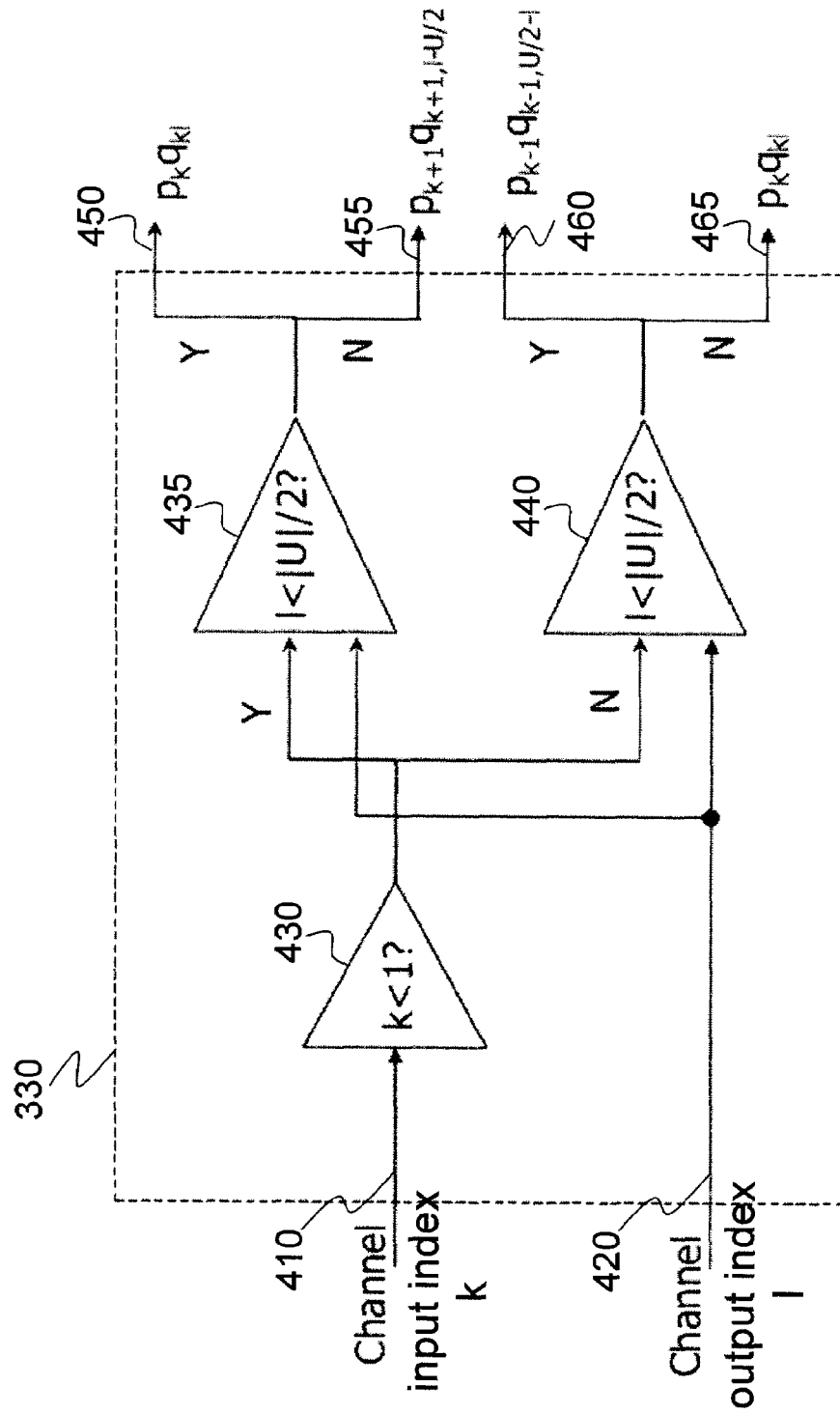
FIGS. 4 and 5 are block logic and bi-partite graph diagrams, respectively, describing a preferred embodiment of the symmetrisizing transform method of the invention for the case where the Slepian-Wolf source is binary.
Figure 5:
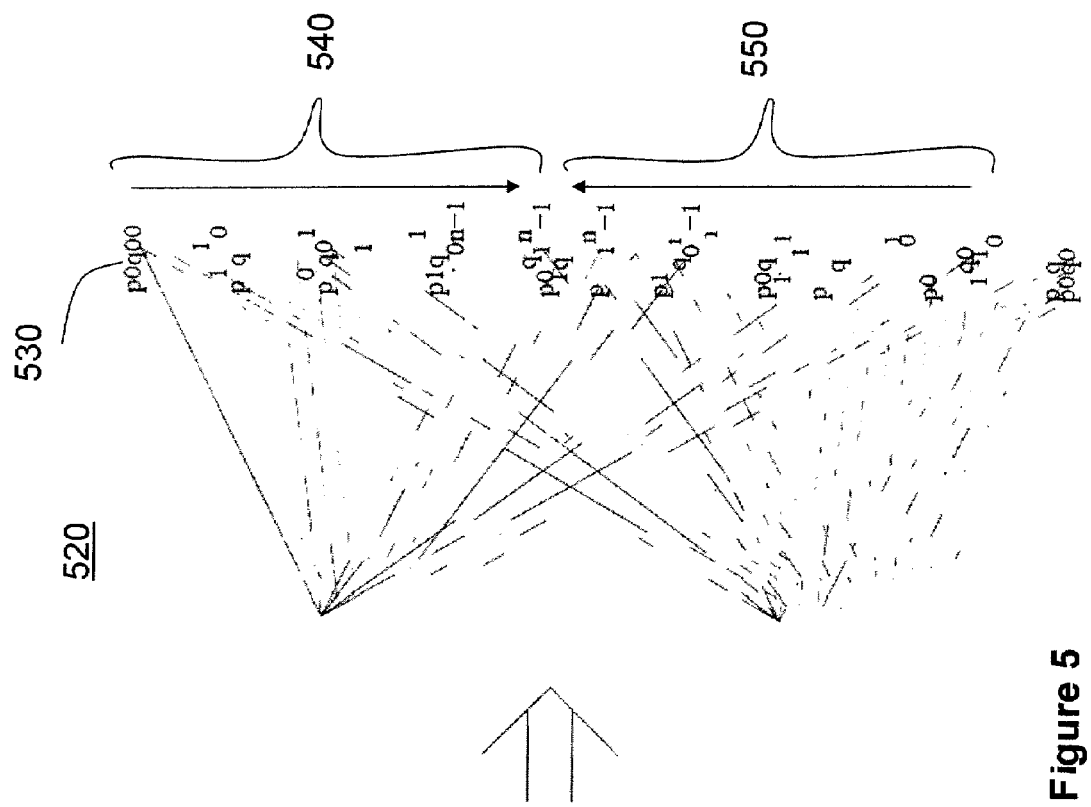
Figure 5:
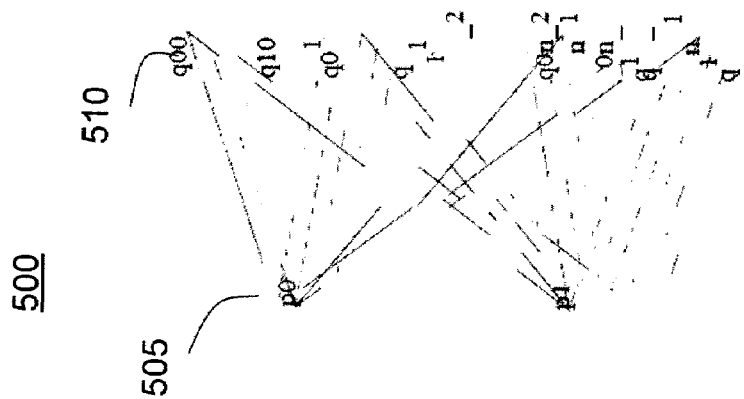

FIG. 4 illustrates the preferred embodiment of the symmetrisizing transform 330 for the case where X is binary, i.e. X=2, and Y has cardinality |Y|=n. In this case |V|=2, |U|=n, and the output symmetric channel generated by the symmetrisizing transform 330 is given as shown in FIG. 4 and FIG. 5, where $p_i$ 505=$p_X(i)$, and $q_{i,j}$ 510=$p_{Y|X=i}(j|i)$. The symmetric channel output index l 420 is provided to decision blocks 435 and 440. The symmetric channel input index k 410 is tested at 430, and if k<1 (i.e. k=0 in the binary implementation) then decision block 435 is tested, otherwise decision block 440 is tested. The output of the symmetrisizing transform is one of 450, 455, 460, and 465, and it represents the value $P_{U|V=k}(l|k)$ for the new symmetric channel. If l<|U|/2 at 435, then the output of symmetrisizing transform 330 is $p_k q_{kl}$ 450 (i.e. $p_0 q_{00}$ as shown in symmetrical items 540 and 550 of FIG. 5). If the test at 435 is negative, then the output of symmetrisizing transform 330 is $P_{k+1} q_{k+1, l-U/2}$ 455 (i.e. $p_1 q_{10}$ as shown in symmetrical items 540 and 550 of FIG. 5). Similarly, if k=1 and the test at 440 is negative, then the output of symmetrisizing transform 330 is $p_k q_{kl}$ 465 (i.e. $p_1 q_{11}$ as shown in symmetrical items 540 and 550 of FIG. 5). If the test at 440 is positive, then the output of symmetrisizing transform 330 is $p_{k-1} q_{k-1, U/2-l}$ 460 (i.e. $p_0 q_{01}$ as shown in symmetrical items 540 and 550 of FIG. 5).

In FIG. 5, item 500 shows the original channel where the marginal input distribution $p_X(i)$ 505 is shown on the left-hand side, and the conditional distribution of the original channel $p_{Y|X=i}(j|i)$ 510 is shown on the right-hand side. Item 520 shows the new symmetric channel which is generated by applying the symmetrisizing transform to the marginal and conditional distributions of the original channel. The quantities shown on the right hand-side are the conditional probabilities $p_{U|V=k}(l|k)$ 530 of the new symmetric channel.

It should be noted that although the illustration in FIGS. 4 and 5 is for a Slepian-Wolf source that is binary, in order to clarify the example, those skilled in the art will appreciate that the same principles can be applied to handle sources having a larger than binary alphabet.

The aim of the method described above is to generate a new, symmetric channel given the marginal and conditional distribution densities of the original channel. The new symmetric channel is represented by its conditional distribution p(U=l|V=k). Thus to generate the new channel we have to generate the probability values p(U=l|V=k) for all l and k, where "l" is the symmetric channel output index and "k" is the symmetric channel input index.

Thus the symmetrisizing transform takes as its input the indices l and k, and generates p(U=l|V=k) for the given l and k. Note that none of the transform outputs are thrown away; the outputs taken together represent the probability distribution p(U=l|V=k)

The symmetries, shown by comparing probabilities 540 and 550 in FIG. 5, flow from the fact that the probabilities generated in this manner result in a symmetric probability distribution for p(U=l|V=k). This symmetric probability distribution is subsequently used by the density evolution method to produce better codes.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A method for efficient construction of Slepian-Wolf codes in a Wyner-Ziv video compression system, comprising:

generating a marginal distribution of original source information and a conditional distribution of original side-information;

transforming said marginal and conditional distributions to generate a new conditional distribution that is symmetric; and computing a Slepian-Wolf code by applying a density evolution algorithm to said new conditional distribution.

2. The method of claim 1, wherein said marginal distribution is not symmetric and said conditional distribution is not symmetric.

3. The method of claim 1, wherein said original source information X takes values in a discrete set $\mathbf{X}$ and said side information Y takes values in a discrete set $\mathbf{Y}$, and said marginal distribution of the original source information X is represented by $p_X(i)$ and said conditional distribution of the original side information Y is represented by $p_{Y|X=i}(j|i)$ for all $i \in \mathbf{X}$ and $j \in \mathbf{Y}$, and wherein said transformation satisfies the constraint $p_{U|V=k}(l|k) = p_{U|V=k}(|\mathbf{U}|-l||\mathbf{V}|-k)$, where $l \in \mathbf{U}$ with $|\mathbf{U}|=|\mathbf{X}||\mathbf{Y}|$, and $k \in \mathbf{V}$ with $|\mathbf{V}|=|\mathbf{X}|$, and for each fixed l and k $p_{U|V=k}(l|k)$ is a predetermined function of $\{p_{Y|X=i}(j|i)\}$ and $\{p_X(i)\}$.

4. The method of claim 1, wherein a cardinality of an alphabet of a source of the new conditional distribution is equal to the cardinality of an alphabet of the original source information.

5. The method of claim 4, wherein a cardinality of an alphabet of a channel output of the new conditional distribution is the product of the cardinality of the alphabet of the original source information and the alphabet of the original side-information.

6. The method of claim 5, wherein a conditional probability of output symbol l given input symbol k, for the new conditional distribution, is given by the product of the marginal probability of the original source information taking a particular value x in its alphabet and the conditional probability of the original side-information taking the value y given that the original source information takes said value x, wherein x and y are functions of l and k.

7. The method of claim 1, wherein the original source information is binarized using a multi-level transform prior to construction of the Slepian-Wolf code.

8. The method of claim 7, wherein a cardinality of an alphabet of a source of said new conditional distribution is equal to two.

9. The method of claim 8, wherein a cardinality of an alphabet of a channel output of said new conditional distribution is twice the cardinality of the alphabet of the original source.

10. The method of claim 9, wherein a conditional probability of output symbol l for said new distribution given input symbol k is given by a product of a marginal probability of the original source information taking a particular value x in its alphabet and a conditional probability of the original side-information taking a particular value y given that the original source takes the value x, wherein x and y are functions of l and k.

11. An apparatus for efficient construction of Slepian-Wolf codes in a Wyner-Ziv video compression system, comprising:

means for generating a marginal distribution of original source information and a conditional distribution of original side-information;

means for transforming said marginal and conditional distributions to generate a new conditional distribution that is symmetric; and means for computing a Slepian-Wolf code by applying a density evolution algorithm to said new conditional distribution.

12. The apparatus of claim 11, wherein said marginal distribution is not symmetric and said conditional distribution is not symmetric.

13. The apparatus of claim 11, wherein said original source information X takes values in a discrete set $\mathbf{X}$ and said side information Y takes values in a discrete set $\mathbf{Y}$, and said marginal distribution of the original source information X is represented by $p_X(i)$ and said conditional distribution of the original side information Y is represented by $p_{Y|X=i}(j|i)$ for all $i \in \mathbf{X}$ and $j \in \mathbf{Y}$, and wherein said transformation satisfies the constraint $p_{U|V=k}(l|k) = p_{U|V=k}(|\mathbf{U}|-l||\mathbf{V}|-k)$, where $l \in \mathbf{U}$ with $|\mathbf{U}|=|\mathbf{X}||\mathbf{Y}|$, and $k \in \mathbf{V}$ with $|\mathbf{V}|=|\mathbf{X}|$, and for each fixed l and k $p_{U|V=k}(l|k)$ is a predetermined function of $\{p_{Y|X=i}(j|i)\}$ and $\{p_X(i)\}$.

14. The apparatus of claim 11, wherein a cardinality of an alphabet of a source of the new conditional distribution is equal to the cardinality of an alphabet of the original source information.

15. The apparatus of claim 14, wherein a cardinality of an alphabet of a channel output of the new conditional distribution is the product of the cardinality of the alphabet of the original source information and the alphabet of the original side-information.

16. The apparatus of claim 15, wherein a conditional probability of output symbol l given input symbol k, for the new conditional distribution, is given by the product of the marginal probability of the original source information taking a particular value x in its alphabet and the conditional probability of the original side-information taking the value y given that the original source information takes said value x, wherein x and y are functions of l and k.

17. The apparatus of claim 11, wherein the original source information is binarized using a multi-level transform prior to construction of the Slepian-Wolf code.

18. The apparatus of claim 17 wherein a cardinality of an alphabet of a source of said new conditional distribution is equal to two.

19. The apparatus of claim 18, wherein a cardinality of an alphabet of a channel output of said new conditional distribution is twice the cardinality of the alphabet of the original source.

20. The apparatus of claim 19, wherein a conditional probability of output symbol l for said new distribution given input symbol k is given by a product of a marginal probability of the original source information taking a particular value x in its alphabet and a conditional probability of the original side-information taking a particular value y given that the original source takes the value x, wherein x and y are functions of l and k.

* * * * *